United States Patent [19]

Crippen et al.

[11] 4,084,174
[45] Apr. 11, 1978

[54] GRADUATED MULTIPLE COLLECTOR STRUCTURE FOR INVERTED VERTICAL BIPOLAR TRANSISTORS

[75] Inventors: Richard E. Crippen, Mountain View; Hemraj K. Hingarh, Santa Clara; Peter W. J. Verhofstadt, Saratoga, all of Calif.

[73] Assignee: Fairchild Camera and Instrument Corporation, Mountain View, Calif.

[21] Appl. No.: 657,439

[22] Filed: Feb. 12, 1976

[51] Int. Cl.² .............. H01L 27/02; H01L 29/72; H01L 29/48; H01L 27/04
[52] U.S. Cl. .......................... 357/44; 357/15; 357/35; 357/36; 357/46; 357/50
[58] Field of Search ............... 357/44, 46, 34–36, 357/15

[56] References Cited

U.S. PATENT DOCUMENTS

| | | | |
|---|---|---|---|
| 3,697,962 | 10/1972 | Beausoleil et al. | 357/44 |
| 3,736,477 | 5/1973 | Berger et al. | 357/36 |
| 3,962,717 | 6/1976 | O'Brien | 357/44 |
| 3,969,748 | 7/1976 | Horie et al. | 357/46 |

OTHER PUBLICATIONS

De Troye "Integrated Injection Logic–Present and Future" IEEE J. Solid–State Circuits vol. SC-9 (10/74) pp. 206–211.
Berger et al. "The Bipolar LSI Breakthrough" Part I, Electronics (9/75) pp. 89–95, Part II, Electronics (10/75) pp. 99–103.

Primary Examiner—William D. Larkins
Assistant Examiner—Gene M. Munson
Attorney, Agent, or Firm—Alan H. MacPherson; Henry K. Woodward; Norman E. Reitz

[57] ABSTRACT

A graduated multiple collector structure for inverted vertical bipolar transistors, integrated injection logic devices and the like. The invention increases the gain of more distant collectors toward which current flows laterally past intervening collectors from a base contact, and injector or the like. The series resistance drop and the current loss in the base-emitter junction are compensated for by progressively increasing the effective area of collectors further distant from the source of the base current. Although the graduated collector structure is applicable to a wide variety of semiconductor devices, it is particularly well suited for use in oxide-isolated integrated injection logic gates. A mathematical model is provided which can help to optimize designs incorporating the graduated collector structure.

8 Claims, 9 Drawing Figures

GRADUATED MULTIPLE COLLECTOR STRUCTURE FOR INVERTED VERTICAL BIPOLAR TRANSISTORS

BACKGROUND OF THE INVENTION

I. Field of the Invention

This invention relates generally to semiconductor devices utilizing inverted vertical bipolar transistors having two or more collectors. More specifically, the invention relates to an improvement in device structure for the control of collector gain.

II. Description of the Prior Art

Vertical bipolar transistors are well known and widely used in bipolar integrated circuit structures. The use of vertical NPN's is generally preferred for high speed applications because the electron mobility in NPN's is greater than the hole mobility in PNP's. Inverted or upside down vertical bipolar transistor structures having multiple collectors disposed above a common emitter are known and have frequently been used to accomplish logic functions. Such structures can be realized by using a buried layer as the common emitter and forming individual collectors in the surface of an epitaxial layer. This structure is taught in U.S. Pat. No. 3,244,950 issued to J. P. Ferguson on Apr. 5, 1966, and entitled "Reverse Epitaxial Transistor."

Interest in inverted vertical bipolar transistors has increased with the advent of a radically different but remarkably simple form of bipolar logic called Integrated Injection Logic or Merged Transistor Logic. Integrated Injection Logic (commonly abbreviated $I^2L$) reduces a logic gate to a merged complementary transistor pair. In such a merged structure, a lateral PNP transistor is generally used as the current source for the base of an inverted vertical bipolar transistor having multiple collectors. The orgin of this logic concept is found in two papers delivered to the IEEE International Solid-State Circuits Conference in Feb. 1972. See H. H. Berger and S. K. Wiedmann, "Merged Transistor Logic (MTL) — A Low-Cost Bipolar Logic Concept," Digest, 1972 ISSCC, pp. 90–91, *Journal of Solid-State Circuits*, Vol. SC-7, 1972, pp. 340–346, and K. Hart and A. Slob, "Integrated Injection Logic: A New Approach to LSI", Digest, 1972 ISSCC, pp. 92–93, *Journal of Solid-State Circuits*, Vol. SC-7, 1972, pp. 346–351. As described in these articles, Integrated Injection Logic possesses the inherent advantage of being able to reduce the size of circuit elements since gates are reduced to a single device format, possesses an inherently low propagation-delay power product as a result of low operating voltage and capacitance, and can generally be fabricated with as few as five masks.

Oxide-isolated semiconductor devices are known to provide sufficient advantages over junction-isolated or cut-and-fill-isolated devices. The employment of Isoplanar Oxide-isolation, as taught in U.S. Pat. No. 3,648,125 issued to D. L. Peltzer on Mar. 7, 1972, entitled "Method of Fabricating Integrated Circuits with Oxidized Isolation and the Resulting Structure", accomplishes the objective of inter-device isolation, achieves high packing densities, reduces sidewall capacitances and reduces direct current losses for vertical bipolar transistors. The fabrication of oxide-isolated Integrated Injection Logic Structures is taught in a U.S. Pat. No. 3,962,717, issued to David O'Brien on June 8, 1976 and entitled "Combined Method for Fabricating Oxide-Isolated Lateral Bipolar Transistors and the Resulting Structures." The Ferguson patent, the Peltzer patent and the O'Brien patent are all assigned to and owned by the assignee of the present application.

A recent, quite readable overview of the present state of integrated injection logic technology can be found in a companion pair of articles by H. H. Berger and S. K. Wiedmann entitled, "The Bipolar LSI Breakthrough, Part I: Rethinking the Problem", *Electronics*, Sept. 4, 1975, pp. 89–95 and "The Bipolar LSI Breakthrough, Part II: Extending the Limits", *Electronics*, Oct. 2, 1975, pp. 99–103.

Most $I^2L$ devices characteristically exhibit an almost linear speed-power product over a wide range of operating currents, but flatten out at high currents. When higher currents are employed to achieve higher speed, the series resistance in the base of the vertical bipolar transistor impedes the lateral current flow from the injector to the multiple collectors. The further a collector is located from the source of base current, the more adversely it is affected by the series resistance. When a plurality of $I^2L$ gates are interconnected to form a logic function, each collector of a multi-collector transistor must be able to short one base current. This means that the current gain per collector must be greater than or equal to unity (if all base currents are assumed equal). As the base current is increased to achieve higher operating speeds, the gain of those collectors most distant from their associated source of base current falls below unity because of the base series resistance described above thereby limiting the maximum speed of the circuit.

SUMMARY OF THE INVENTION

The present invention overcomes many of the disadvantages associated with milti-collector inverted vertical bipolar transistors known in the prior art. It does so by providing a novel graduated multiple collector structure which allows such transistors to be operated at speeds faster than heretofore possible. The invention is applicable to inverted vertical bipolar transistors of the type formed in a substantially planar upper surface of a semiconductor substrate possessing a first transistor region of one conductivity type which extends laterally over a portion of the planar surface and downwardly into the substrate; a second transistor region having an opposite conductivity type disposed in the first transistor region, the second transistor region extending downwardly from the upper surface of the first transistor region to form a second region bounding pn junction therein; a base current region disposed on a portion of the surface of the second transistor region through which a base current flows into the second transistor region; a third transistor region of the one conductivity type disposed in the second transistor region separated from the base current region by portions of the second transistor region, the third transistor region extending downwardly from a portion of the upper surface of the second transistor region having a first collector area to form a third region bounding pn junction therein; a fourth transistor region of one conductivity type disposed in the second transistor region separated from both the base current region and the third transistor region by portions of the second transistor regions, the fourth transistor region extending downwardly from a portion of the surface of the second region having a second collector area to form a fourth region bounding pn junction therein, wherein the improvement includes having the second collector area greater than the first collector area and disposing the third transistor region laterally substantailly colinearally between the base current region and the fourth transistor region, whereby the inverted vertical transistor structure possesses two collectors each with gain greater than a selected minimum value at a selected operating current which results from the unequal lateral displacement of the third and the fourth transistor regions from the base current region combined with the graduated collector area relationship.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which.

DETAILED DESCRIPTION OF THE PREFERRED EMBODIMENT

Figure 1:
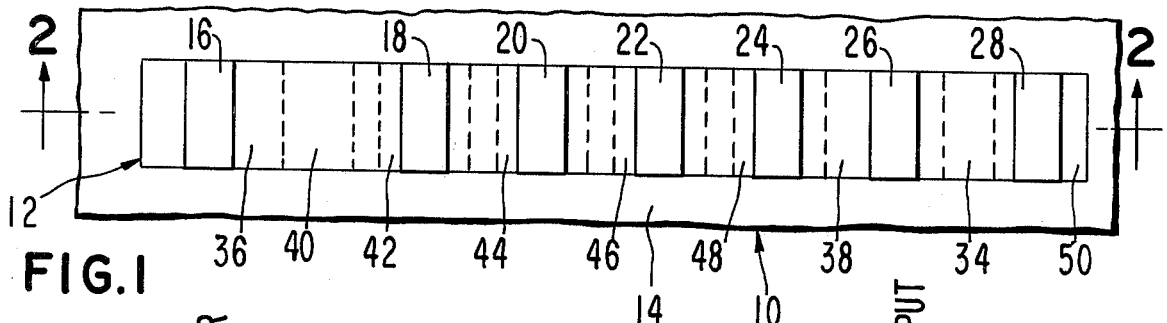
FIG. 1 is a top view of a prior art oxide-isolated integrated injection logic semiconductor structure having four colinearly disposed equal area collectors to which the present invention is an improvement.

Referring now to the several figures and specifically to FIG. 1, a prior art integrated injection logic structure is shown viewed from above. An active device area 12 is peripherally bounded by portions of isolation oxide 14. Portions of aluminum terminals 16 through 28 inclusive make electrical contact with underlying portions of semiconductor material. The internal structure of the integrated injection logic device 10 can best be seen by reference to FIG. 2 which is a stylized cross-sectional view as seen through the lines 2—2 in FIG. 1. The structure shown in FIGS. 1 and 2 can be fabricated using the process taught in the O'Brien application referenced above to which the reader is directed for specific material and process details. However, it is to be understood that the graduated collector structure of the present invention is applicable to and can be used with a wide variety of semiconductor structures fabricated with other materials and processes.

Figure 2:
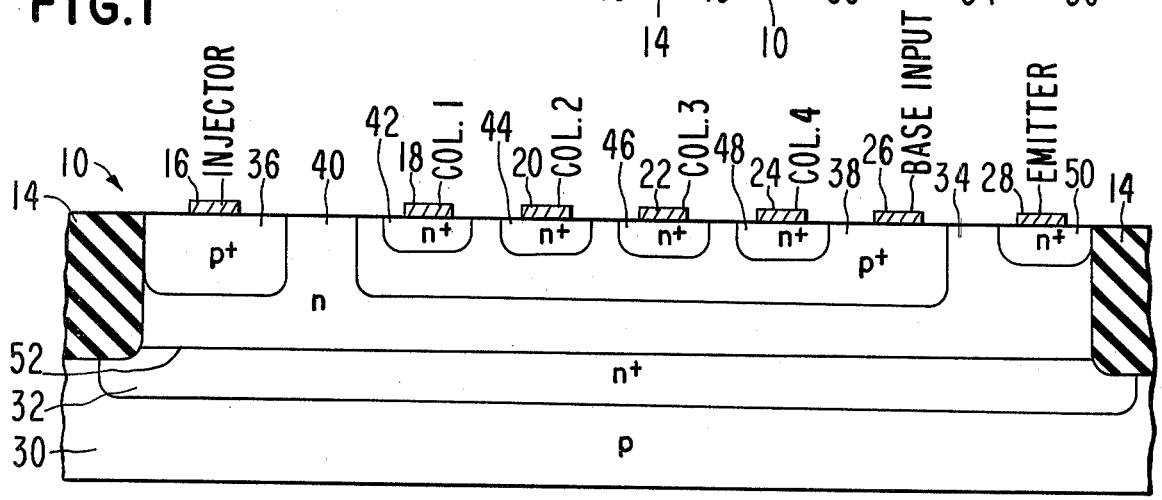
FIG. 2 is a stylized cross-sectional view of the structure shown in FIG. 1 as seen through the lines 2—2.
Figure 3:
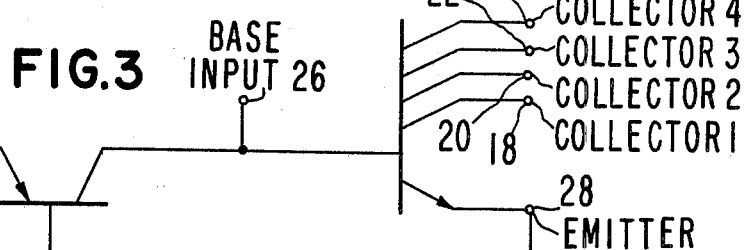
FIG. 3 is a schematic diagram of the structure shown in FIGS. 1 and 2.

In FIG. 2, a mono-crystalline silicon semiconductor substrate 30 of $p$ type conductivity has a buried layer 32 of $n+$ type conductivity selectively formed in portions of its upper surface. This layer can be formed using well known diffusion or ion implantation techniques. An epitaxial layer 34 of $n$ type conductivity is grown on the upper surfaces of the substrate 30 and the buried layer 32. The metallurgical interface between the epitaxial silicon layer 34 and the underlying buried layer region 32 in the upper surface of the substrate 30 is denoted by a line 52. In this structure, a portion of the epitaxial layer 34 is electrically isolated by regions of oxidized epitaxial silicon 14 and a laterally extending isolation pn junction formed between the substrate 30 and the buried layer 32. In operation, the buried layer 32 functions to distribute charge uniformly within the isolated portion of the epitaxial layer 34. A first transistor region of $p+$ type conductivity 36 is disposed in the epitaxial layer 34 as shown. The first transistor region 36 extends downwardly from the upper surface of the epitaxial layer 34 to form a first region bounding pn junction therein. A second transistor region 38 also of $p+$ type conductivity is similarly disposed above the buried layer 32 in the epitaxial layer 34 separated from the first transistor region 36 by an interstatial portion 40 of the epitaxial layer 34. The second transistor region 38 extends downwardly from the upper surface of the epitaxial layer 34 to form a second region bounding pn junction therein. Regions 36, 40 and 38 form a lateral PNP type bipolar transistor. Electrical contact is made with the regions 36 and 38 through the aluminum terminals 16 and 26 respectively. Electrical contact to the $n$ type portions of the epitaxial layer 34 including the interstatial portion 40 is made through an $n+$ region 50 which extends downwardly from the surface of the layer as shown and to which the aluminum terminal 28 is connected. Four collector regions 42, 44, 46 and 48 of $n+$ type conductivity are disposed in the second transistor region 38 substantially as shown. Each of the four collector regions extends downwardly from a portion of the upper surface of the region 38 having an associated collector area to form a respective collector region bounding pn junction within the region 38 thereby forming a four collector NPN type inverted vertical bipolar transistor from the epitaxial layer 34, the first transistor region 38 and the four collector regions 42, 44, 46 and 48. Each of the collectors are separated from one another by portions of the region 38. In this and other prior art collector structures the four collector areas are equal. Electrical contact is made to the collector regions 42, 44, 46 and 48 by the aluminum terminals 18, 20, 22, and 24 respectively. The second transistor region 38 of $p+$ type conductivity functions as the collector of the lateral PNP transistor and as the base of the four collector NPN type inverted vertical transistor. This structural interrelationship can be clearly seen by reference to the schematic diagram in FIG. 3.

In operation, the emitter of the lateral PNP transistor 16, commonly called the injector and so labeled in the figures, injects current laterally into the base region 38 of the inverted vertical PNP transistor. This injection current $I_{INJ}$ flows laterally in the $p+$ region 38 to the four collectors. Part of the injected current $I_{INJ}$ escapes from the base region 38 into the emitter of the vertical NPN through parasitic diode losses at the region 38 bounding pn junction.

As best seen in FIG. 1, portions of the four collector regions 42, 44, 46 and 48 partially abut the isolation oxide 14. Walling the collectors thusly reduces the amount of charge which is stored capacitively between each collector and the base region 38 thereby reducing the propagation delay time at low current levels. However, such a configuration forces all of the injected current to flow in the narrow region beneath the collectors. At high current levels the resistance of the narrow region beneath the collectors impedes or "pinches" the lateral flow of injected base current. The series resistance and associated voltage drop increases with an increase in the lateral displacement of a collector from the source of injected base current.

Figure 4:
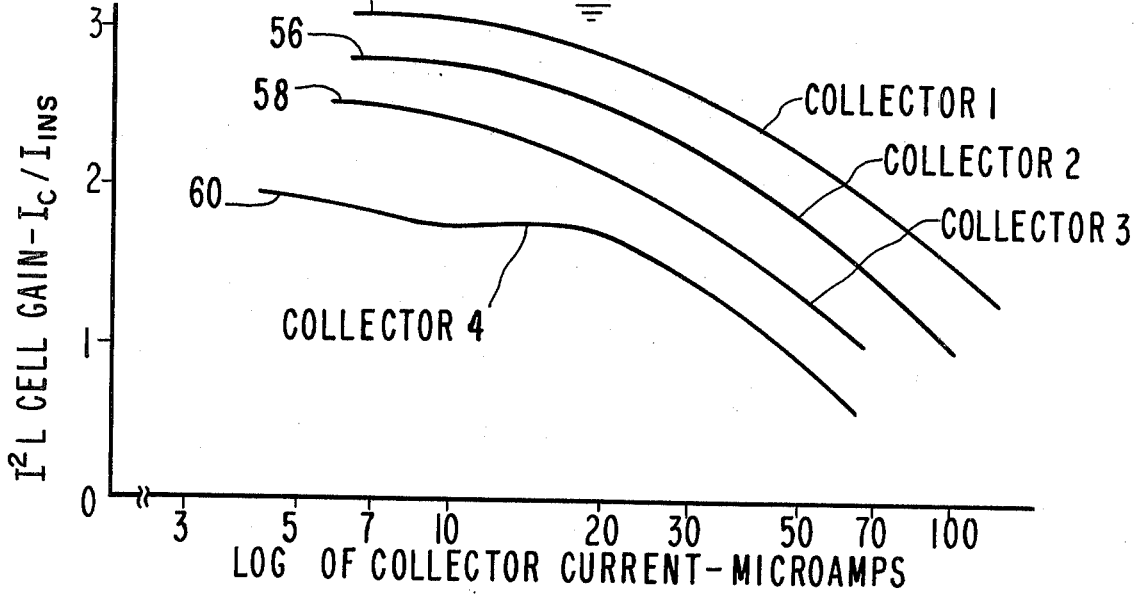
FIG. 4 is a graphical representation of the I²L cell gain relationship between each of four equal area collectors shown in the FIG. 1 structure.

The effect of the base series resistance is clearly shown in FIG. 4 which is a graphical representation of the I²L cell gain of each of the four equal area collectors shown in the FIG. 1 structure. Line 54 depicts the relationship for the first collector. Lines 56, 58 and 60 depict the relationship for the second, third and fourth collectors respectively. Where the I²L cell gain is defined as the individual collector current, $I_C$, divided by the injector current, $I_{INJ}$, collector 4, the collector displaced furthest from the injector as shown in FIG. 2 exhibits less gain than the collectors closer to the source of the injected base current.

The four collector inverted vertical bipolar transistor shown in FIG. 2 can be operated alone without injected base current from the complementary lateral PNP bipolar transistor. This can be accomplished by applying a base current directly to the base input terminal 26. However, if the base input terminal 26 is disposed as shown in FIG. 2 then the realtive gain of the collectors will be reversed, i.e., collector 1 will exhibit lower gain than collectors 2, 3, and 4 because collector 1 is most distant from the source of base current (the terminal 26).

Figure 5:
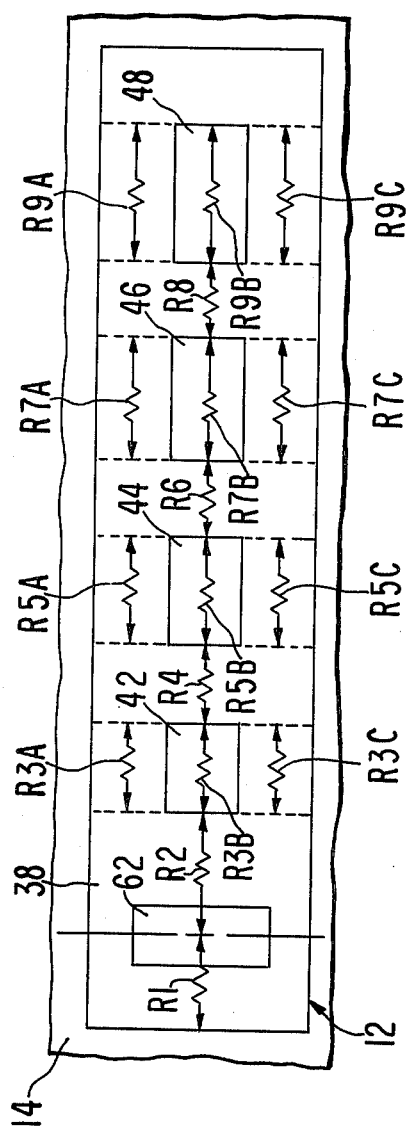
FIG. 5 is a top view of a generalized inverted vertical bipolar transistor structure with four colinearally disposed collectors showing a division of the structure into a plurality of resistive regions.

FIG. 5 is a top view of a generalized inverted vertical bipolar transistor structure with four colinearly disposed collectors showing a division of the structure into a plurality of resistive regions. The FIG. 5 structure is similar to the inverted vertical transistor portion of the FIG. 1 structure. However, the collector regions 42, 44, 46 and 48 do not abut the isolation oxide (are non-walled collectors) and have unequal collector areas. Moreover, an emitter contact 28 to the portion of n type epitaxial layer underlying the base region 38 of p+ type material is not shown. Such a connection can be made remotely by extending the buried layer 32 beneath the oxide isolation 14 away from the active device area 12. Ohmic contact is made to the upper surface of the base region 38 at a base contact region 62.

Figure 6:
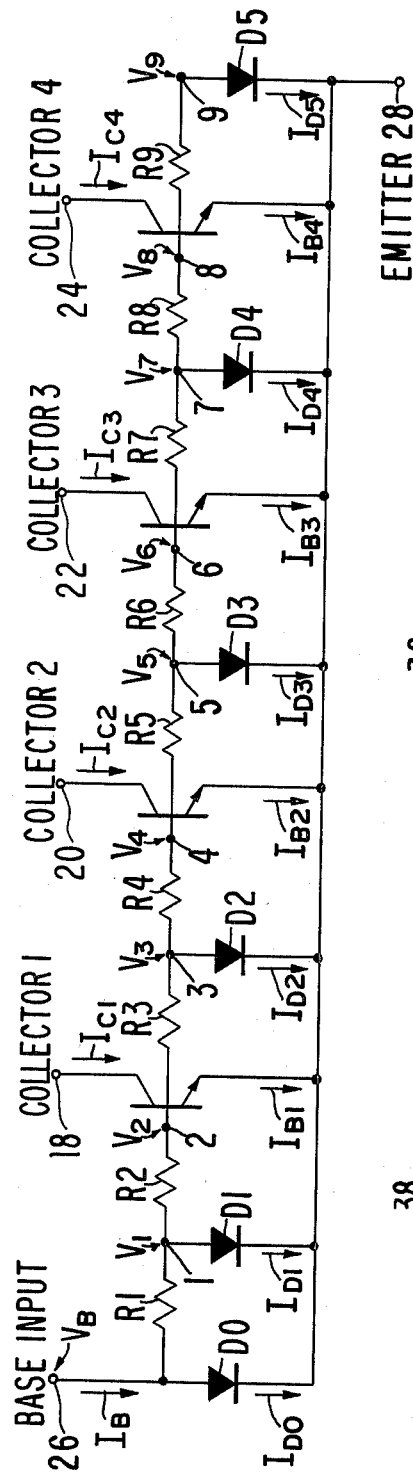
FIG. 6 is a schematic diagram of an equivalent circuit used to mathematically model the generalized four collector inverted vertical bipolar transistor structure shown in FIG. 5.

FIG. 6 is a schematic diagram of an equivalent circuit used to mathematically model the generalized four collector inverted vertical bipolar transistor structure shown in FIG. 5. As discussed above, the gain for each collector is differentially affected by parasitic diode action at the region 38 bounding pn junction and by the base series resistance which increases with increased displacement from the source of base current. This deterioration in collector gain is largely a function of the geometry of the vertical transistor rather than the method of fabrication. For example, it is possible to achieve equal gain in four equal area collectors by locating a collector at 90° increments about the periphery of a circle having a base contact region located at its center. However, colinear collector configurations are preferred for ease of interconnection to form complex integrated logic functions and provide the most efficient use of chip area.

In a preferred colinear collector structure, as the current flows through the base region 38, (either from a base contact region 62 or from an injector, if the vertical transistors is part of an integrated injection logic structure), the potential drop in the transverse direction causes a progressive reduction of DC bias on the active emitter-base diodes underneath the successive collectors. Thus the injected current tends to be crowded near the first collector (nearest the source of base current). This results in a reduction of effective injection under the successive collectors and requires a larger bias at the base emitter terminal for the same injected current that would be the case if the injection were uniform over the entire base region. This effect increases with increasing base current and is quite significant for devices with small geometries.

The equivalent circuit shown in FIG. 6 divides the parasitic diode at the region 38 bounding pn junction into six parts represented schematically as the diodes D0, D1, D2, D3, D4 and D5. These individual parasitic diodes are weighted according to their respective intercollector areas and interspersed in a distributed resistance network as shown. The scheme for establishing the resistance network is shown in FIG. 5. Although smaller area subdivisions are possible to achieve greater modeling accuracy, satisfactory results have been obtained with the divisions shown. For purposes of the model, it is assumed that the p type silicon semiconductor material in the base region 38 can be subdivided into portions having one of the two characteristic resistances. The p portions of the base region 38 lying in registration beneath the individual collectors are assigned one characteristic resistance. All other p portions of the base region 38 are assigned another characteristic resistance. In applicant's experiments the characteristic resistance for the material beneath the collectors was approximately 5K and 10K ohms per square unit. The characteristic resistance for the other portions was approximately 150 ohms per square unit. Knowledge of the specific dimensions and characteristic resistances for any given structure similar to the one shown in FIG. 5 allows all of the resistances shown in that figure to be calculated. It is to be understood that the resistor R3 shown in FIG. 6 is determined by calculating the value in parallel of the resistors R3A, R3B, and R3C shown in FIG. 5. The resistances R5, R7 and R9 shown in FIG. 6 are determined in analogous fashion.

Using the equivalent circuit shown in FIG. 6 it is possible to express the total base current $I_B$ as follows:

$$I_B = I_{D0} + I_{D1} + I_{B1} + I_{D2} + I_{B2} + I_{D3} + I_{B3} + I_{D4} + I_{B4} + I_{D5} \quad (1)$$

where $I_{D0}, I_{D1}, I_{D2}, I_{D3}, I_{D4}$ and $I_{D5}$ are the respective parasitic diode currents for the six parasitic diodes shown in the FIG. 6 equivalent circuit and $I_{B1}, I_{B2}, I_{B3},$ and $I_{B4}$ are the respective base currents for the four intrinsic NPN inverted vertical bipolar transistors also shown in FIG. 6.

The base voltage $V_B$ at the node 26 shown in FIG. 6 can be expressed as the sum of the end voltage $V_9$ at the last node 9 and the resistive voltage drops at the intermediate nodes 8, 7, 6, 5, 4, 3, 2, and 1 respectively as follows:

$$V_B = V_9 + \\ R9 \times I_{D5} + \\ R8 \, (I_{D5} + I_{B4}) + \\ R7 \, (I_{D5} + I_{B4} + I_{D4}) + \\ R6 \, (I_{D5} + I_{B4} + I_{D4} + I_{B3}) + \quad (2)$$

-continued $$R5 (I_{D5} + I_{B4} + I_{D4} + I_{B3} + I_{D3}) +$$
$$R4 (I_{D5} + I_{B4} + I_{D4} + I_{B3} + I_{D3} + I_{B2}) +$$
$$R3 (I_{D5} + I_{B4} + I_{D4} + I_{B3} + I_{D3} + I_{B2} + I_{D2}) +$$
$$R2 (I_{D5} + I_{B4} + I_{D4} + I_{B3} + I_{D3} + I_{B2} + I_{D2} + I_{B1}) +$$
$$R1 (I_{D5} + I_{B4} + I_{D4} + I_{B3} + I_{D3} + I_{B2} + I_{D2} + I_{B1} + I_{D1}).$$

The individual collector currents $I_{C1}$, $I_{C2}$, $I_{C3}$ and $I_{C4}$ for the four intrinsic NPN vertical inverted bipolar transistors having collector areas $A_1$, $A_2$, $A_3$ and $A_4$ respectively can be calculated starting from the well-known diode equation:

$$I_D = I_{SAT}(\exp \frac{qV_D}{kT} - 1) \quad (3)$$

where $I_D$ is the current flowing through the diode, $I_{SAT}$ is the saturation current of the diode $V_D$ is the voltage across the diode, $q$ is the charge on an electron, $K$ is the well-known Boltzmanns constant and $T$ is the temperature in degrees Kelvin. Using the diode equation (3), the currents $I_{C1}$, $I_{C2}$, $I_{C3}$ and $I_{C4}$ can be expressed as follows:

$$I_{C1} = A_1 I_0 (\exp \frac{qV_2}{kT} - 1); \quad (4)$$

$$I_{C2} = A_2 I_0 (\exp \frac{qV_4}{kT} - 1); \quad (5)$$

$$I_{C3} = A_3 I_0 (\exp \frac{qV_6}{kT} - 1); \text{ and} \quad (6)$$

$$I_{C4} = A_4 I_0 (\exp \frac{qV_8}{kT} - 1). \quad (7)$$

where $I_0$ is the saturation current per unit area for the four transistors and $V_2$, $V_4$, $V_6$ and $V_8$ are the voltages at the nodes 2, 4, 6, and 8 respectively shown in FIG. 6. Under normal operating conditions exp $(qV_2/kT)$, exp $(qV_4/kT)$, exp $(qV_6/kT)$ and exp $(qV_8/kT)$ are all much larger than 1, and equations (4), (5), (6) and (7) can be simplified as follows:

$$I_{C1} = A_1 I_0 \exp \frac{qV_2}{kT}; \quad (8)$$

$$I_{C2} = A_2 I_0 \exp \frac{qV_4}{kT}; \quad (9)$$

$$I_{C3} = A_3 I_0 \exp \frac{qV_6}{kT}; \text{ and} \quad (10)$$

$$I_{C4} = A_4 I_0 \exp \frac{qV_8}{kT}. \quad (11)$$

Examination of the FIG. 6 equivalent circuit together with equation (2) indicates that $V_2$, the base emitter voltage for the first collector at the node 2 will always be higher than $V_8$, the base emitter voltage for the fourth collector at the node 8. Therefore, if all the collector areas $A_1$, $A_2$, $A_3$ and $A_4$ are equal, the fourth collector current $I_{C4}$ will always be less than the first collector current $I_{C1}$. Moreover, because of the exponential nature of the relationship between the base emitter voltage and the associated collector current, the current starvation in the fourth collector is further accentuated at higher base current levels.

Applicants' novel invention compensates for the series resistance drop in base emitter voltage thereby increasing collector current in collectors further distant from the source of base current by graduating the collector areas. Using the graduated collector structure of the invention, applicants have made four collector inverted vertical bipolar transistor structures in which the collector most distant from the source of base current has been able to sink more current than the collector nearest the source of base current over a wide range of input conditions.

Although the mathematical model, the several figures and applicants' presently preferred embodiments (which are discussed in greater detail below) all focus on four collector structures, it is to be understood that the graduated structure of the invention can be used with devices having two or more collectors. However, as a practical matter, functional integrated injection logic cells with more than eight collectors disposed colinearly on one side of an injector are very difficult to achieve because of gain limitations in the collectors most distant from the injector.

The mathematical model provided above can be used to derive, for example, the relationship between the area of the first collector $A_1$ and the area of the fourth collector $A_4$ required to ensure that the associated collector currents $I_{C1}$ and $I_{C4}$ respectively are equal. Alter setting $I_{C1} = I_{C4}$, equations (8) and (11) can be combined as follows:

$$A_1 I_0 \exp \frac{qV_2}{kT} = A_4 I_0 \exp \frac{qV_8}{kT} \quad (12)$$

Rearranging terms yields:

$$\frac{A_1}{A_4} = \exp \frac{q(V_8 - V_2)}{kT} \quad (13)$$

Taking the natural log of both sides of equation (13) and rearranging terms gives:

$$\frac{kT}{q} \ln \frac{A_1}{A_4} = V_8 - V_2 \quad (14)$$

$V_8 - V_2$ can be read directly from part of equation (2), therefore:

$$\frac{kT}{q} \ln \frac{A_1}{A_4} = \quad (15)$$
$$R8 (I_{D5} + I_{B4}) +$$
$$R7 (I_{D5} + I_{B4} + I_{D4}) +$$
$$R6 (I_{D5} + I_{B4} + I_{D4} + I_{B3}) +$$
$$R5 (I_{D5} + I_{B4} + I_{D4} + I_{B3} + I_{D3}) +$$
$$R4 (I_{D5} + I_{B4} + I_{D4} + I_{B3} + I_{D3} + I_{B2}) +$$
$$R3 (I_{D5} + I_{B4} + I_{D4} + I_{B3} + I_{D3} + I_{B2} + I_{D2}).$$

C. S. den Brinker and A. N. Morgan describe an equivalent circuit similar to the one shown in FIG. 6 in a paper entitled "The Effects of Series Resistance and Distributed Parasitic Diode Action on Multi Collector I²L Structures." This paper was delivered at the first European Solid State Circuit Conference—ESYCIR-C—held Sept. 2-5, 1975 in Canterbury, England.

Figure 7:
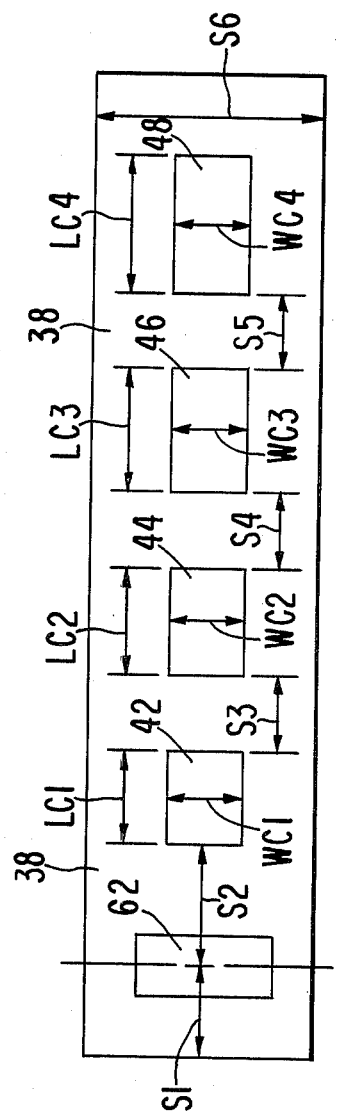
FIG. 7 is a top view of the FIG. 5 structure showing selected reference dimensions.
Figure 8:
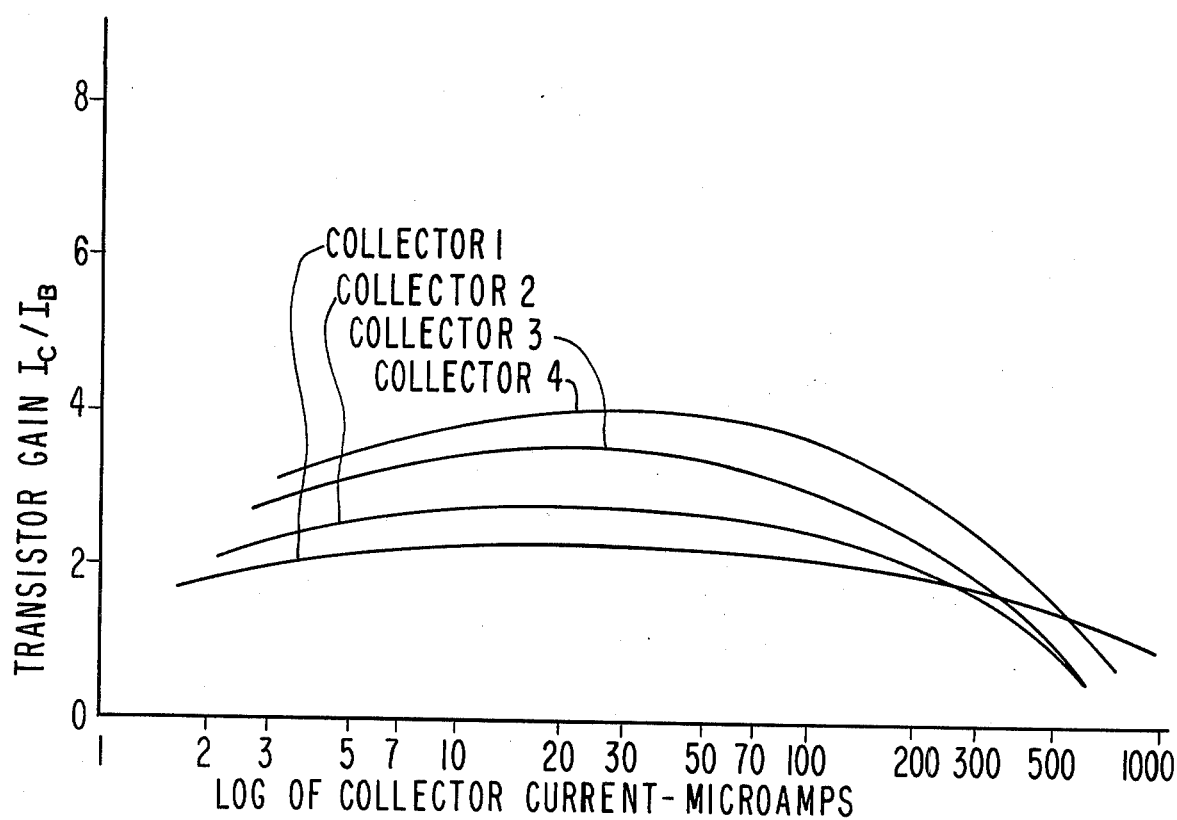
FIG. 8 is a graphical representation of the current-gain relationship between each of the four collectors in one presently preferred embodiment.

Applicants have fabricated a first presently preferred embodiment of the graduated multiple collector structure of the invention using the process current in the O'Brien application referenced above. A graphical representation of the current-gain relationship between each of the four collectors in the first presently preferred embodiment is shown in FIG. 8. FIG. 7 is a top view of the FIG. 5 structure showing selected reference dimensions. These selected reference dimensions for the first presently preferred embodiment are given in Table 1.

TABLE 1

| S1 = 6 microns | LC1 = 6 microns | WC1 = 5 microns |
|---|---|---|
| S2 = 8 " | LC2 = 7 " | WC2 = 5 " |
| S3 = 5 " | LC3 = 8 " | WC3 = 5 " |
| S4 = 5 " | LC4 = 9 " | WC4 = 5 " |
| S5 = 5 " | | |
| S6 = 15 " | | |

The first presently preferred embodiment has been optimized to provide the best operating speed characteristics at collector currents up to 300 microamps.

Figure 9:
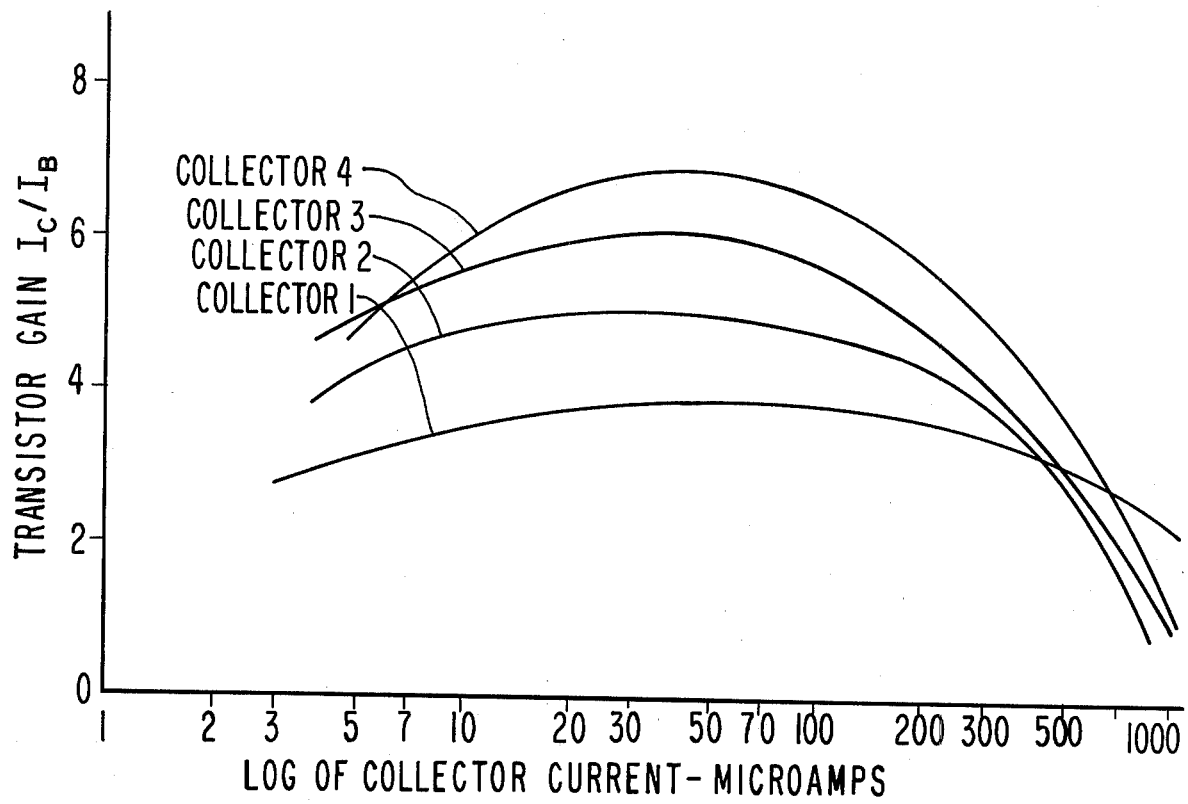
FIG. 9 is a graphical representation of the current-gain relationship between each of the four collectors in another presently preferred embodiment.

FIG. 9 is a graphical representation of the current gain relationship between each of the four collectors in a second presently preferred embodiment. The second presently preferred embodiment has been optimized to provide the fastest operating speeds at collector currents above 300 microamps. The selected reference dimensions shown in FIG. 7 for the second presently preferred embodiment of the graduated collector structure are given in Table 2.

TABLE 2

| S1 = 6 microns | LC1 = 6 microns | WC1 = 8 microns |
|---|---|---|
| S2 = 8 " | LC2 = 7 " | WC2 = 8 " |
| S3 = 5 " | LC3 = 8 " | WC3 = 8 " |
| S4 = 5 " | LC4 = 9 " | WC4 = 8 " |
| S5 = 5 " | | |
| S6 = 18 " | | |

Although the two presently preferred embodiments achieve increased collector areas by increasing the logitudinal length dimension and maintaining a constant collector width, other graduated collector geometries are possible. For example, the length of each collector can remain constant and the width of successive collectors increase. Moreover, the individual collectors need not be rectangular. Graduated circular or eleiptical collectors can also be used as the important factor is collector surface areas.

Another important variation of the present invention is its application to collector structures employing Schottky clamp diodes to reduce the magnitude of logic swings thereby reducing power delay. Moreover, the metal of the Schottky clamp can even substitute for a semiconductor region and be used directly as a collector. In such a structure, the relative gain of two or more collectors colinearally disposed on one side of a source of base current is controlled by increasing the metal diode area of collectors more distant from the source of base current.

The first presently preferred embodiment of the graduated multiple collector structure for inverted vertical bipolar transistors of the invention is incorporated as part of an integrated injection logic structure in a microprogram sequencer bearing Fairchild Part No. 9408.

From the foregoing detailed description, it will be evident that there are a number of changes, adaptations and modifications of the present invention which come within the province of those skilled in the art; however, it is intended that all such variations not departing from the spirit of the invention be considered as within the scope thereof as limited solely by the appended claims.

What is claimed is:

1. A semiconductor structure comprising:
a semiconductor substrate of one conductivity type having a substantially planar surface;
an epitaxial layer formed on said substantially planar surface of said semiconductor substrate, said epitaxial layer having a conductivity type opposite said one conductivity type of said semiconductor substrate;
a buried layer region of said opposite conductivity type disposed in said substantially planar surface of said semiconductor substrate;
a first transistor region of said one conductivity type disposed above said buried layer region in said epitaxial layer, said first transistor region extending downwardly from the upper surface of said epitaxial layer to form a first region bounding pn junction therein;
a second transistor region of said one conductivity type disposed above said buried layer region in said epitaxial layer and separated from said first transistor region by an interstitial portion of said epitaxial layer, said second transistor region extending downwardly from the upper surface of said epitaxial layer to form a second region bounding pn junction therein;
a third transistor region of said opposite conductivity type disposed in said second transistor region, said third transistor region extending downwardly from a portion of the upper surface of said second transistor region having a first collector area to form a third region bounding pn junction within said second transistor region;
a fourth transistor region of said opposite conductivity type disposed in said second transistor region substantially colinear with and separated from said first and said third transistor regions, said third transistor region lying laterally between said first and said fourth transistor regions, said fourth transistor region extending downwardly from a portion of the upper surface of said second transistor region having a second collector area greater than said first collector area to form a fourth region bounding pn junction within said second transistor region, whereby said semiconductor structure forms a lateral bipolar transistor and a merged complementary inverted vertical bipolar transistor having two collectors each with gain greater than a selected minimum value at a selected operating current which results from the unequal lateral displacement of said third and said fourth transistor regions from said first transistor region combined with the graduated collector area relationship; and
means for applying a bias potential of a polarity which would tend to reverse bias each of said third and fourth region bounding pn junctions.

2. The semiconductor structure of claim 1 wherein said one conductivity type is $n$ type and said opposite conductivity type is $p$ type.

3. The semiconductor structure of claim 1 wherein said one conductivity type is $p$ type and said opposite conductivity type is $n$ type.

4. The semiconductor structure of claim 1 additionally comprising:
a first Schottky diode formed within said first collector area on a portion of the upper surface of said second transistor region; and
a second Schottky diode formed within said second collector area on a portion of the upper surface of said second transistor region.

5. A semiconductor structure comprising:

a semiconductor substrate of one conductivity type having a substantially planar surface;

a device region formed in said substantially planar surface of said semiconductor substrate, said device region having a conductivity type opposite said one conductivity type of said semiconductor substrate;

a first transistor region of said one conductivity type disposed in said device region, said first transistor region extending downwardly from the upper surface of said device region to form a first transistor region bounding pn junction therein;

a second transistor region of said one conductivity type in said device region and separated from said first transistor region by an interstitial portion of said device region, said second transistor region extending downwardly from the upper surface of said device region to form a second transistor region bounding pn junction therein;

a third transistor region of said opposite conductivity type disposed in said second transistor region, said third transistor region extending downwardly from a portion of the upper surface of said second transistor region having a first collector area to form a third transistor region bounding pn junction within said second transistor region;

a fourth transistor region of said opposite conductivity type disposed in said second transistor region substantially colinear with and separated from said first and third transistor regions, said third transistor region lying laterally between said first and said fourth transistor regions, said fourth transistor region extending downwardly from a portion of the upper surface of said second transistor region having a second collector area greater than said first collector area to form a fourth transistor region bounding pn junction within said second transistor region, whereby said semiconductor structure forms a lateral bipolar transistor and a merged complementary inverted vertical bipolar transistor having two collectors each with gain greater than a selected minimum value at a selected operating current which results from the unequal lateral displacement of said third and said fourth transistor regions from said first transistor region combined with the graduated collector area relationship; and means for applying a bias potential of a polarity which would tend to reverse bias each of said third and fourth region bounding pn junctions.

6. The semiconductor structure of claim 5 wherein said one conductivity type is $n$ type and said opposite conductivity type is $p$ type.

7. The semiconductor structure of claim 5 wherein said one conductivity type is $p$ type and said opposite conductivity is $n$ type.

8. The semiconductor structure of claim 5 additionally comprising:

a first Schottky diode formed within said first collector area on a portion of the upper surface of said second transistor region; and a second Schottky diode formed within said second collector area on a portion of the upper surface of said second transistor region.

* * * * *